(12) United States Patent
Brass et al.

(10) Patent No.: US 6,456,553 B1
(45) Date of Patent: Sep. 24, 2002

(54) CIRCUIT CONFIGURATION FOR SWITCHING OVER A RECEIVER CIRCUIT IN PARTICULAR IN DRAM MEMORIES AND DRAM MEMORY HAVING THE CIRCUIT CONFIGURATION

(75) Inventors: Eckhard Brass, Unterhaching; Thoai-Thai Le, München; Jürgen Lindolf, Friedberg; Joachim Schnabel, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/898,233

(22) Filed: Jul. 3, 2001

(30) Foreign Application Priority Data

Jul. 3, 2000 (DE) .......................................... 100 32 236

(51) Int. Cl.$^7$ ................................................. G11C 7/00
(52) U.S. Cl. ................... 365/222; 365/226; 365/189.09
(58) Field of Search ................................. 365/222, 226, 365/229, 189.06, 189.09, 207; 327/53, 54, 535

(56) References Cited

U.S. PATENT DOCUMENTS

| 5,557,221 | A |   | 9/1996 | Taguchi et al. ................ 327/53 |
| 5,920,208 | A |   | 7/1999 | Park ................................. 327/54 |
| 6,081,472 | A | * | 6/2000 | Jeong .............................. 365/222 |

* cited by examiner

Primary Examiner—David Lam
(74) Attorney, Agent, or Firm—Laurence A. Greenberg; Werner H. Stemer; Ralph E. Locher

(57) ABSTRACT

A circuit configuration for switching over a receiver circuit, in particular in DRAM memories, between a standby mode and an operating mode, includes a differential amplifier functioning as a receiver receiving a control voltage derived from a reference current and generated or fed in for setting a correct operating point of said differential amplifier. A line feeds a current for generating the control voltage. Switching elements are disposed in said line for each receiver. The switching elements are permanently closed in the operating mode by an enable signal present at said switching elements for continuously supplying the current for generating the control voltage. The switching elements are closed at discrete times or periodically in the standby mode by feeding a refresh signal for discontinuously refreshing the control voltage. A DRAM memory having the circuit configuration is also provided.

8 Claims, 1 Drawing Sheet

Figure 1:
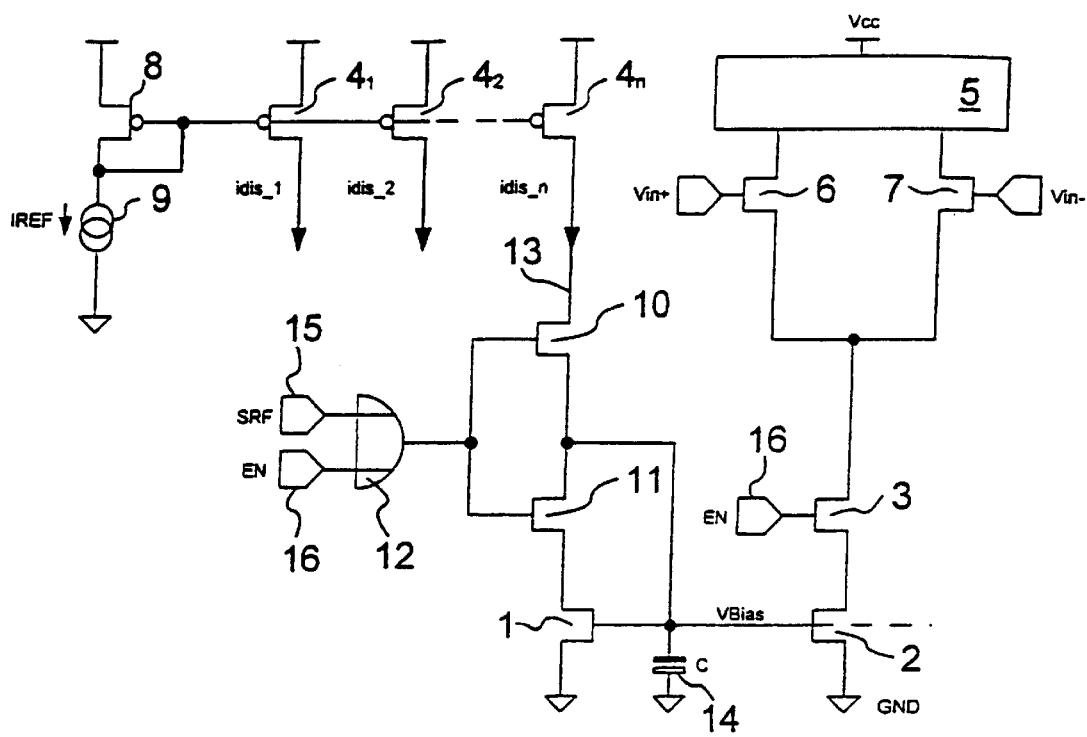

CIRCUIT CONFIGURATION FOR SWITCHING OVER A RECEIVER CIRCUIT IN PARTICULAR IN DRAM MEMORIES AND DRAM MEMORY HAVING THE CIRCUIT CONFIGURATION

BACKGROUND OF THE INVENTION

Field of the Invention

The invention relates to a circuit configuration for switching over a receiver circuit, in particular in DRAM memories, between a standby mode and an operating mode. A differential amplifier functions as a receiver. A control voltage derived from a reference current and serving for setting a correct operating point of the differential amplifier is generated or fed in for each differential amplifier. The invention also relates to a DRAM memory having the circuit configuration.

In the case of laptop or notebook applications, in particular, it is necessary for memory modules, in particular DRAM memory modules, which are contained therein, to also have a low current consumption in a power-down or standby mode. In the memory module, differential amplifiers function as receivers, which need a control voltage for setting the correct operating point thereof. In existing DRAM memory modules, the control voltage is generated from a reference current which is distributed through current mirrors. Whereas the receivers can be switched off in the power-down or standby mode, the distributed currents must not be switched off, in order to ensure that the receivers are immediately available again, i.e. as far as possible in one clock cycle, in the event of reactivation of the memory chip in the operating mode.

Therefore, a standby current continuously flows through the known memory chips while they are in the standby mode. The standby current is not negligible and, when a laptop or notebook is battery-operated, is a constant load on the battery. The current paths distributed through current mirrors could be switched off in the standby mode by a respective switching transistor located in the individual lines feeding the current to the receivers. However, as already mentioned above, the control voltage of the receivers must not be switched off in the standby mode, since otherwise the receivers might possibly not be able to be reactivated quickly enough in the event of switching over to the operating mode.

U.S. Pat. No. 5,557,221 (columns 1 to 16, figure sheets 1 to 8) describes and shows, in particular in FIG. 8, a circuit configuration for switching over a receiver circuit, in which switching over between a first operating mode and a second, current-saving mode is effected in a manner dependent on a frequency or amplitude present at an input.

U.S. Pat. No. 5,920,208 discloses a switch-over device for a sense amplifier with which an end of a read operation is detected through the use of a data comparison, and a switch-over to a power-down mode is performed.

SUMMARY OF THE INVENTION

It is accordingly an object of the invention to provide a circuit configuration for switching over a receiver circuit, in particular in DRAM memories, and a DRAM memory having the circuit configuration, which avoid the hereinafore-mentioned disadvantages of the heretofore-known switch-over configurations between standby or power-down mode and operating mode and which maintain a control voltage of receivers even in the standby or power-down mode with reduced standby current, in such a way that the receivers can be activated sufficiently quickly, e.g. within a few nanoseconds, in the event of a transition to the operating mode.

With the foregoing and other objects in view there is provided, in accordance with the invention, a circuit configuration for switching over a receiver circuit between a standby mode and an operating mode. The configuration comprises differential amplifiers each functioning as a receiver receiving a control voltage derived from a reference current and fed in or generated, for setting a correct operating point of the differential amplifier. A line feeds a current for generating the control voltage. Switching elements are disposed in the line for each receiver. The switching elements are permanently closed in the operating mode by an enable signal present at the switching elements for continuously supplying the current for generating the control voltage. The switching elements are closed at discrete times or periodically in the standby mode by feeding a refresh signal for discontinuously refreshing the control voltage.

Consequently, with the present circuit configuration according to the invention, the control voltage for the differential amplifiers functioning as a receiver circuit is refreshed discontinuously or periodically. In this way, the standby current for the receivers is considerably reduced. In DRAM memories, in particular, a separate generator for a periodic refresh signal for switching on the switching elements can be omitted if, as is preferred, the self-refresh signal of the DRAM memory is used. It goes without saying, however, that it is also possible to use a switch-on signal for the switching elements which is derived from the self-refresh signal and has a period that is a multiple of the self-refresh period.

In order to stabilize the control voltage fed discontinuously or periodically to the receivers, backup capacitors assigned to each receiver can be used for prolonging the refresh time.

Other features which are considered as characteristic for the invention are set forth in the appended claims.

Although the invention is illustrated and described herein as embodied in a circuit configuration for switching over a receiver circuit, in particular in DRAM memories, and a DRAM memory having the circuit configuration, it is nevertheless not intended to be limited to the details shown, since various modifications and structural changes may be made therein without departing from the spirit of the invention and within the scope and range of equivalents of the claims.

The construction and method of operation of the invention, together with additional objects and advantages thereof will be best understood from the following description of specific embodiments when read in connection with the drawings.

BRIEF DESCRIPTIONS OF THE DRAWINGS

The FIGURE of the drawing is a schematic and block diagram of one possible realization of a circuit configuration according to the invention.

DESCRIPTION OF THE PREFERRED EMBODIMENTS

Referring now in detail to the single FIGURE of the drawing, there is seen a differential amplifier 6, 7 which forms a receiver for a load 5 having an operating point defined by a control voltage that is generated from a current flowing from a current mirror transistor 2 through an enable transistor 3. The enable transistor 3 is closed by an enable signal (EN) 16 in an operating mode. An intensity of the current flowing from the current source 2 is determined by a reference voltage $V_{BIAS}$, which is determined by a charge of a backup capacitor 14 in a standby mode. In standby, in a manner described below, the backup capacitor 14 having a capacitance C is charged periodically or discontinuously by a current Idis_n flowing through a lead 13. This current Idis_n originates from a current mirror circuit including current mirror transistors $4_1, 4_2, \ldots 4_n$, a transistor 8 and a reference current source 9 through which a reference current IREF flows.

In order to ensure that the receivers are available again within a few nanoseconds in the event of reactivation of the chip in the operating mode, as mentioned, in the standby mode the control voltage for the differential amplifier 6, 7 is taken from the charge of the backup capacitor 14.

According to the invention, switching elements 10, 11, 12 are provided in the lead 13 for generating the reference voltage $V_{BIAS}$. The switching elements 10 and 11 are preferably MOS transistors, and the switching element 12 forms an OR element which receives a periodic or discontinuous refresh signal SRF 15 in the standby mode and receives the enable signal (EN) 16 in the operating mode.

Furthermore, the backup capacitor 14 is constructed in such a way that it can stabilize the reference voltage $V_{BIAS}$ and thus prolong the refresh time.

During "power-down", i.e. in the standby mode (EN=0), the MOS transistors 10, 11 are activated only in a refresh cycle (SRF periodically or discontinuously equal to 1) and switch the current fed through the line 13 to the transistor 1.

In the case of a DRAM memory, the refresh signal 15 may be the periodic self-refresh signal that is present anyway in the memory. A generator for generating the refresh signal 15 can thus be omitted.

It goes without saying that the refresh period may also be a multiple of the self-refresh period.

In other applications, the refresh signal 15 may also be non-periodic as long as the capacitance of the backup capacitor 14 is large enough to bridge the longest time duration between two successive refresh signals.

With the above-described embodiment of a circuit configuration according to the invention, as illustrated in the figure, the standby current in the power-down or standby mode can be significantly reduced and the receivers can nevertheless be reactivated very quickly in the event of switch-over to the operating mode.

It goes without saying that the circuit configuration according to the invention can be used not only in dram memories but also in other configurations in which a reduction of the standby current flowing through receivers in the standby mode is desirable.

We claim:

1. A circuit configuration for switching over a receiver circuit between a standby mode and an operating mode, comprising:

a differential amplifier functioning as a receiver receiving a control voltage derived from a reference current, for setting a correct operating point of said differential amplifier;

a line feeding a current for generating the control voltage; and switching elements disposed in said line for said receiver, said switching elements permanently closed in the operating mode by an enable signal present at said switching elements for continuously supplying the current for generating the control voltage, and said switching elements closed at discrete times or periodically in the standby mode by feeding a refresh signal for discontinuously refreshing the control voltage.

2. The circuit configuration according to claim 1, wherein the control voltage is generated for said differential amplifier.

3. The circuit configuration according to claim 1, wherein the control voltage is fed in to said differential amplifier.

4. The circuit configuration according to claim 1, wherein said switching elements are MOS switching transistors.

5. The circuit configuration according to claim 1, wherein the refresh signal is a memory self-refresh signal of a DRAM memory.

6. The circuit configuration according to claim 1, wherein the refresh signal is a signal having a period duration being a multiple of a period of a memory self-refresh signal of a DRAM memory.

7. The circuit configuration according to claim 1, including at least one backup capacitor for said receiver, said at least one backup capacitor having a capacitance sufficient for storing a charge due to the current supplied by said switching elements over a time duration exceeding a longest period duration of the refresh signal.

8. A DRAM memory, comprising a circuit configuration for switching over a receiver circuit between a standby mode and an operating mode, said circuit configuration including:

a differential amplifier functioning as a receiver receiving a control voltage derived from a reference current, for setting a correct operating point of said differential amplifier;

a line feeding a current for generating the control voltage; and switching elements disposed in said line for said receiver, said switching elements permanently closed in the operating mode by an enable signal present at said switching elements for continuously supplying the current for generating the control voltage, and said switching elements closed at discrete times or periodically in the standby mode by feeding a refresh signal for discontinuously refreshing the control voltage.

* * * * *